United States Patent
Chen et al.

(10) Patent No.: US 8,170,217 B2
(45) Date of Patent: May 1, 2012

(54) AUDIO SIGNAL PROCESSING APPARATUS

(75) Inventors: Ming-Hsiung Chen, Taipei (TW);
Shang-Shu Chung, Taipei (TW);
Ming-Chung Li, Taipei (TW)

(73) Assignee: Princeton Technology Corporation, Hsin Tien, Taipei County (TW)

( * ) Notice: Subject to any disclaimer, the term of this patent is extended or adjusted under 35 U.S.C. 154(b) by 1109 days.

(21) Appl. No.: 12/007,953

(22) Filed: Jan. 17, 2008

(65) Prior Publication Data
US 2009/0074210 A1    Mar. 19, 2009

(30) Foreign Application Priority Data
Sep. 17, 2007 (TW) ............................... 96215638 U

(51) Int. Cl.
*H04H 20/00* (2008.01)
(52) U.S. Cl. .................... 381/2; 381/1; 381/28
(58) Field of Classification Search ............... 381/1–17, 381/120, 28, 57, 102, 104, 106; 700/94; 330/10
See application file for complete search history.

(56) References Cited

U.S. PATENT DOCUMENTS

| | | | | |
|---|---|---|---|---|
| 6,665,246 B2 * | 12/2003 | Moriwaki | | 369/47.55 |
| 7,023,267 B2 * | 4/2006 | Lee et al. | | 330/10 |
| 7,492,220 B2 * | 2/2009 | Chiu et al. | | 330/10 |
| 2002/0183025 A1 * | 12/2002 | Seaberg et al. | | 455/132 |
| 2003/0194970 A1 * | 10/2003 | Hoyt et al. | | 455/63.1 |
| 2005/0046478 A1 * | 3/2005 | Ohara et al. | | 330/251 |
| 2005/0117663 A1 * | 6/2005 | Drogi et al. | | 375/316 |
| 2006/0282185 A1 * | 12/2006 | Mallinson | | 700/94 |
| 2007/0008031 A1 * | 1/2007 | Kranz | | 330/10 |
| 2008/0024210 A1 * | 1/2008 | Park | | 330/10 |
| 2008/0272813 A1 * | 11/2008 | Bouillet | | 327/161 |

FOREIGN PATENT DOCUMENTS

| | | |
|---|---|---|
| CN | 1267955 | 9/2000 |
| CN | 1717863 A | 1/2006 |
| WO | WO-2005/081449 A1 | 9/2005 |

* cited by examiner

*Primary Examiner* — Cuong Q Nguyen
*Assistant Examiner* — Yosef Gebreyesus
(74) *Attorney, Agent, or Firm* — Muncy, Geissler, Olds & Lowe, PLLC

(57) ABSTRACT

An audio signal processing apparatus is provided. The audio signal processing apparatus comprises a clock generator, a processing module, an amplifying module and an output module. The clock generator is used for generating a clock signal. The processing module is coupled to the clock generator for processing the clock signal and generating a processing signal. The amplifying module is coupled to the processing module for amplifying the processing signal and generating an amplifying signal. The output module is coupled to the amplifying module for outputting the amplifying signal.

11 Claims, 5 Drawing Sheets

AUDIO SIGNAL PROCESSING APPARATUS

BACKGROUND OF THE INVENTION

1. Field of the Invention

The invention relates generally to an audio signal processing apparatus, and more particularly to an audio signal processing apparatus that does not interfere with reception of amplitude modulation broadcasts.

2. Description of the Related Art

Audio amplifiers, characterized by a wave output in the form of pulse width modulation (PWM), are commonly known as class D audio amplifiers. Class D audio amplifiers generate a high frequency square-wave output with harmonic distortion. When the output of a class D audio amplifier is connected to a load through an interconnecting line of a long length, then the interconnecting line operates as a transmitting antenna that could interfere with other electronic equipments. Specifically, amplitude modulation (AM) radios receive interference, which is undesirable.

Generally, the frequency band of the AM radio spans from 520 kilohertz (KHz) to 1.8 megahertz (MHz). However, the frequency band is on the base frequency of a switching frequency or AM radio harmonics from the class D audio amplifier. It has been found that serious interference with AM broadcasts is caused during operation of the class D audio amplifier. The radiated electric field of the class D audio amplifier has a greater magnitude than that of an AM broadcasting station from air when the class D audio amplifier is integrated with a tuner. Therefore, when the frequency band of the AM broadcasting station is near the switching frequency of the class D audio amplifier, the reception is intercepted by the electromagnetic radiation from the class D audio amplifier, thereby causing a so-called "jam" phenomenon. FIG. 1 is a diagram of a jam reception due to a clock signal Sc generated from a class D audio amplifier. As shown in FIG. 1, the second harmonic frequency 10 of the clock signal Sc from the class D audio amplifier falls on the receiving frequency F3. As a result, the receiving frequency F3 of the AM broadcasts is jammed and unable to be received. Additionally, side bands further extend, when the switching frequency of the class D audio amplifier shifts. Thus, as the number of the AM broadcast stations with interference increases, the problem where users cannot receive the AM broadcasts becomes more severe.

Consequently, there is a need for a class D audio amplifier for avoiding the conventional problems of interfering with AM broadcasts.

BRIEF SUMMARY OF THE INVENTION

Therefore, in order to solve the aforementioned problems, one object of the invention is to provide an audio signal processing apparatus that does not interfere with reception of amplitude modulation (AM) broadcasts when a class D audio amplifier is utilized.

In one embodiment of the invention, an audio signal processing apparatus comprises a clock generator, a processing module, an amplifying module and an output module. The clock generator is used for generating a clock signal. The processing module is coupled to the clock generator for processing the clock signal and generating a processing signal. The amplifying module is coupled to the processing module for amplifying the processing signal and generating an amplifying signal. The output module is coupled to the amplifying module for outputting the amplifying signal.

For simplicity and a thorough understanding of the above, related items, features, and advantages of the present invention, and preferred embodiments will be described below with reference to the accompanying drawing.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 2:
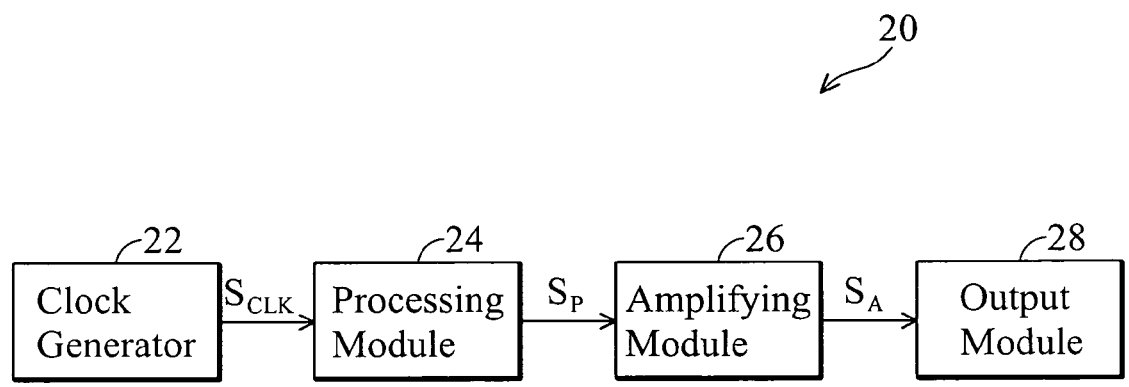
FIG. 2 is a schematic diagram of an audio signal processing apparatus according to the invention.
Figure 3:
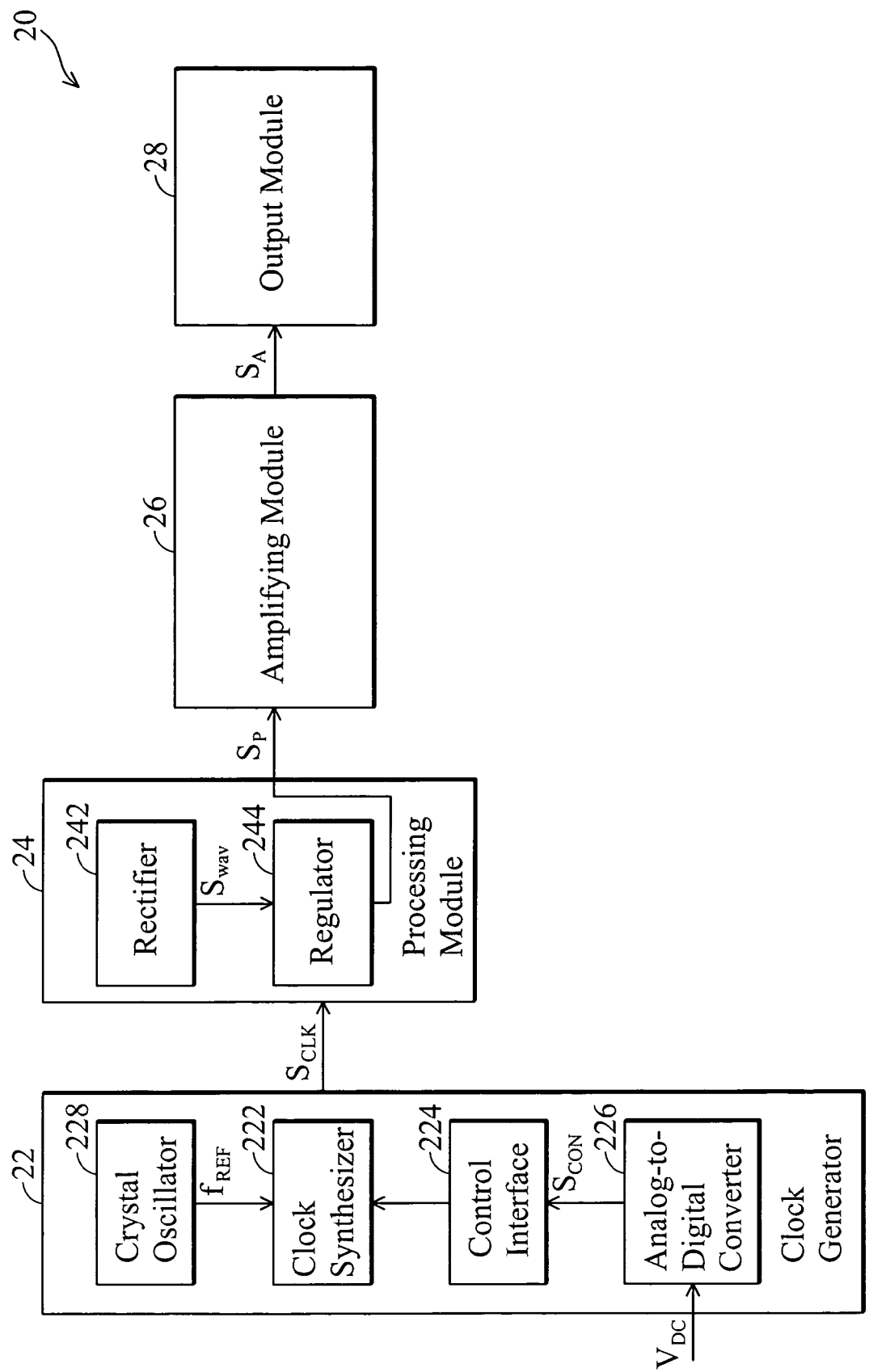
FIG. 3 is a schematic diagram of an audio signal processing apparatus in accordance with one embodiment of the invention.
Figure 4:
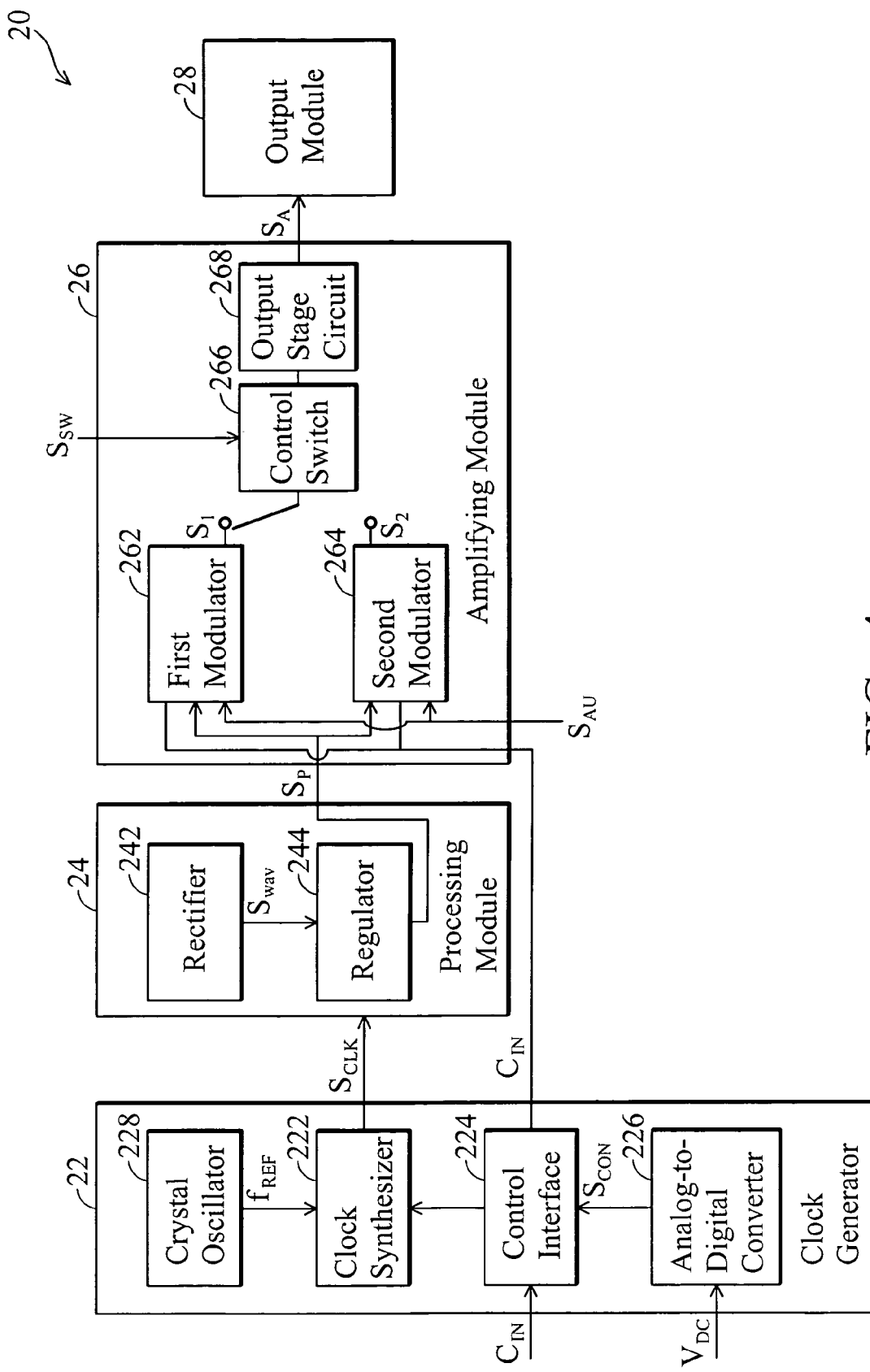
FIG. 4 is a schematic diagram of an audio signal processing apparatus in accordance with another embodiment of the invention.

Referring to FIG. 2, FIG. 2 is a schematic diagram of an audio signal processing apparatus according to the invention. As shown in FIG. 2, an audio signal processing apparatus 20 according to the embodiment comprises a clock generator 22, a processing module 24, an amplifying module 26 and an output module 28. The clock generator 22 is used for generating a clock signal $S_{CLK}$. The processing module 24 is coupled to the clock generator 22 for processing the clock signal $S_{CLK}$ and generating a processing signal $S_P$. The amplifying module 26 is coupled to the processing module 24 for amplifying the processing signal $S_P$ and generating an amplifying signal $S_A$. The output module 28 is coupled to the amplifying module 26 for outputting the amplifying signal $S_A$. Referring to FIG. 3 and FIG. 4 simultaneously, FIG. 3 shows a schematic diagram of an audio signal processing apparatus in accordance with one embodiment of the invention. FIG. 4 shows a schematic diagram of an audio signal processing apparatus in accordance with another embodiment of the invention. In FIG. 3 and FIG. 4, the clock generator 22 further comprises a clock synthesizer 222 for generating the clock signal $S_{CLK}$. Moreover, the clock generator 22 comprises a control interface 224, coupled to the clock synthesizer 222, for receiving a control signal $S_{CON}$. The clock synthesizer 222 then generates the clock signal $S_{CLK}$ according to the control signal $S_{CON}$. The clock generator 22 further comprises an analog-to-digital converter 226, coupled to the control interface 224, for converting a DC voltage $V_{DC}$ to the control signal $S_{CON}$. Additionally, in one embodiment, the clock generator 22 comprises a crystal oscillator 228, coupled to the clock synthesizer 222, for generating a reference frequency $f_{REF}$. As a result, the clock synthesizer 222 generates the clock signal $S_{CLK}$ according to the reference frequency $f_{REF}$.

The processing module 24 comprises a rectifier 242 and a regulator 244. The rectifier 242 generates a rectified signal $S_{WAV}$ by rectifying the clock signal $S_{CLK}$. The regulator 244 is coupled to the rectifier 242 for generating the processing signal $S_P$ by regulating the level of the rectified signal $S_{WAV}$.

In the embodiment of FIG. 3, the amplifying module 26 is a power amplifier. Further, the amplifying module 26 is a class D audio amplifier and the output module 28 is a speaker for broadcasting the amplifying signal $S_A$ from the amplifying module 26.

In another embodiment of FIG. 4, amplifying module 26 comprises a first modulator 262, a second modulator 264, a control switch 266 and an output stage circuit 268. The first modulator 262, is coupled to the control interface 224 of the clock generator 22 and the processing module 24 for generating a first modulated signal $S_1$ by modulating an audio input signal $S_{AU}$ and the processing signal $S_P$ according to an input clock $C_{IN}$. The second modulator 264, is coupled to the control interface 224 of the clock generator 22 and the processing module 24 for generating a second modulated signal $S_2$ by modulating the audio input signal $S_{AU}$ and the processing signal $S_P$ according to the input clock $C_{IN}$. The input clock $C_{IN}$, received by the control interface 224 of the clock generator 22, is transmitted to the first modulator 262 and the second modulator 264. One terminal of the control switch 206 is selectively coupled to the first modulator 262 and the second modulator 264 for switching between the first modulator 262 and the second modulator 264, thereby outputting the first modulated signal $S_1$ and the second modulated signal $S_2$ in response to a switch control signal $S_{SW}$. The output stage circuit 268 is coupled to another terminal of the control switch 266 for generating the amplifying signal $S_A$ through the control switch 266 by amplifying the first modulated signal $S_1$ from the first modulator 262 and the second modulated signal $S_2$ from the second modulator 264. In the embodiment, the first modulator 262 is a pulse width modulator and the second modulator 264 is a sigma-delta pulse width modulator.

Figure 1:
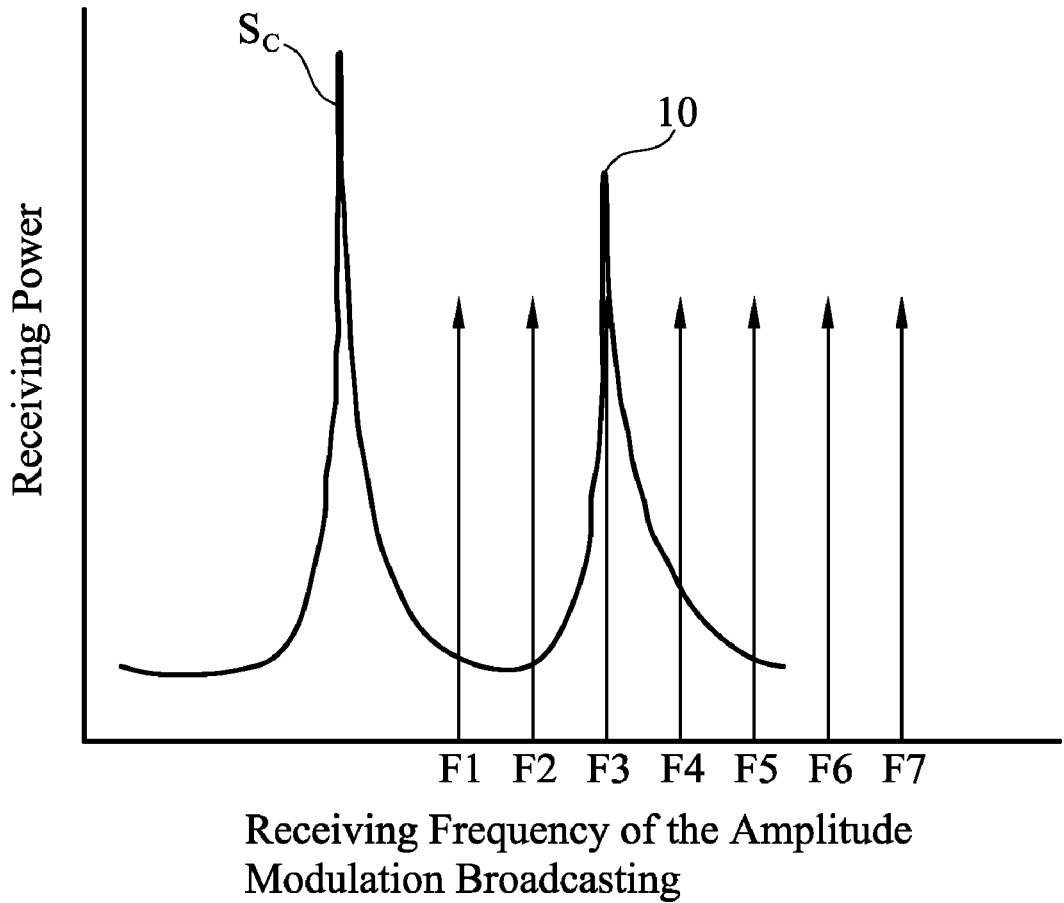
FIG. 1 is a diagram of a jam reception from a class D audio amplifier.
Figure 5:
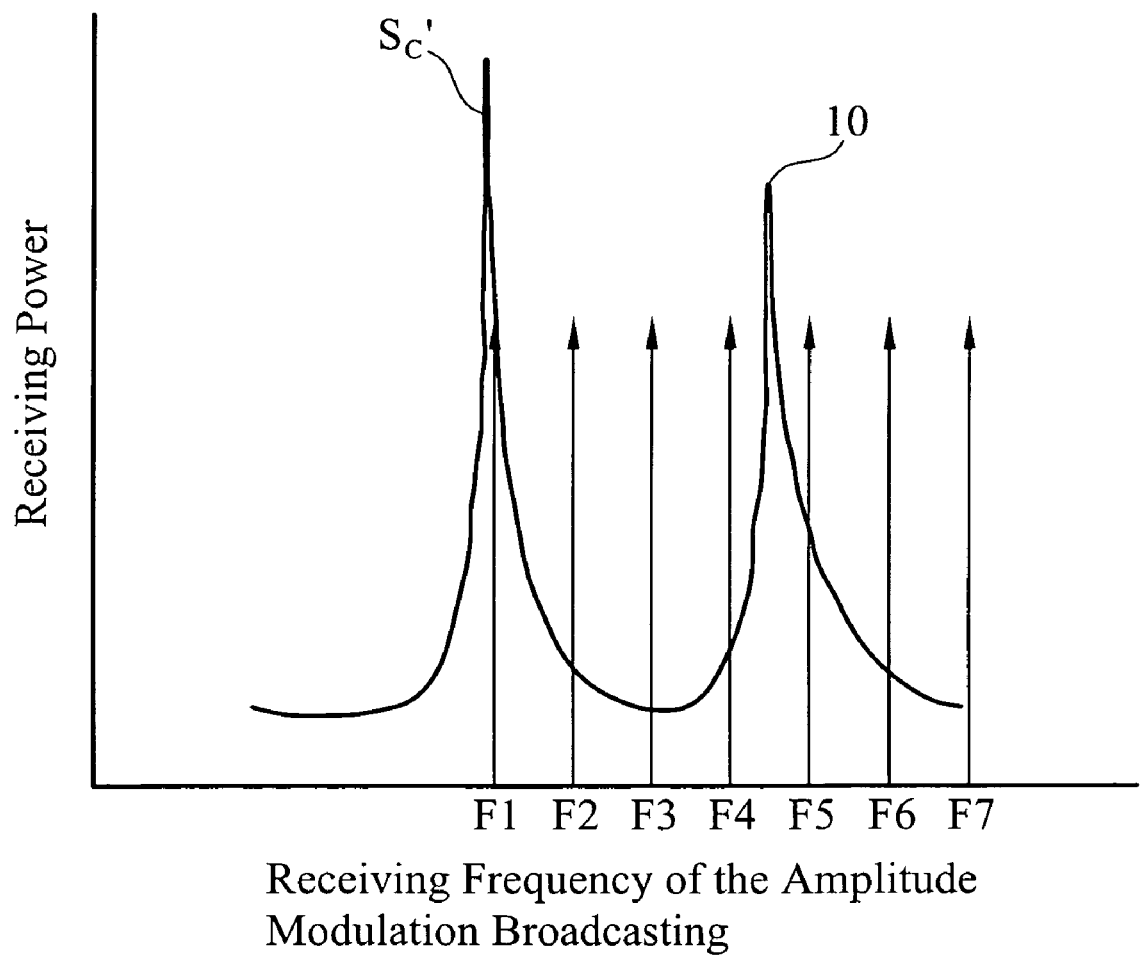
FIG. 5 is a diagram of a modulated clock signal from an audio signal processing apparatus according to the invention.

FIG. 5 is a diagram of a modulated clock signal from an audio signal processing apparatus according to the invention. The frequency of the modulated clock signal Sc' can prevent the amplitude modulation broadcast reception from being interfered with by the class D audio amplifier. The reason is as follows. As shown in FIG. 5, when the frequency of the clock signal is modified by the audio signal processing apparatus of the invention, the second harmonic frequency 10 of the clock signal Sc' from the class D audio amplifier is staggered with respect to the modulation frequency F3. Therefore, the signal corresponding to the receiving frequency F3 of the amplitude modulation broadcasts can be clearly received to eliminate the conventional jam phenomenon shown in FIG. 1. Furthermore, it is necessary that the receiving frequency F3 of the amplitude modulation broadcast is staggered with respect to the clock signal and the second harmonic from the class D audio amplifier by above 20 KHz. Consequently, the audio signal processing apparatus of the invention is able to fine tune the clock signal of the class D audio amplifier and guarantee the best performance.

According to each embodiment of the invention, the audio signal processing apparatus utilizes the clock generator to generate the clock signal according to the real application. The audio input signal is further amplified to generate the amplifying signal and then outputted from the speaker. The problem derived from interfering with reception of amplitude modulation broadcasts is prevented when the class D audio amplifier is utilized.

While the invention has been described by way of example and in terms of preferred embodiments, it is to be understood that the invention is not limited to the disclosed embodiments. To the contrary, it is intended to cover various modifications and similar arrangements (as would be apparent to those skilled in the Art). Therefore, the scope of the appended claims should be accorded the broadest interpretation so as to encompass all such modifications and similar arrangements.

What is claimed is:

1. An audio signal processing apparatus, comprising:
    a clock generator for generating a clock signal comprising:
        a control interface for receiving a control signal; and
        a clock synthesizer coupled to the control interface for generating the clock signal according to the control signal;
    a processing module coupled to the clock generator for processing the clock signal and generating a processing signal;
    an amplifying module coupled to the processing module for amplifying the processing signal and generating an amplifying signal; and
    an output module coupled to the amplifying module for outputting the amplifying signal.

2. The audio signal processing apparatus of claim 1, wherein the clock generator further comprises an analog-to-digital converter, coupled to the control interface, for converting a DC voltage to the control signal.

3. The audio signal processing apparatus of claim 1, wherein the clock generator further comprises a crystal oscillator, coupled to the clock synthesizer, for generating a reference frequency, wherein the clock synthesizer generates the clock signal according to the reference frequency.

4. The audio signal processing apparatus of claim 1, wherein the processing module comprises:
    a rectifier for rectifying the clock signal to obtain a rectified signal; and
    regulator coupled to the rectifier for regulating the level of the rectified signal and generating the processing signal.

5. The audio signal processing apparatus of claim 1, wherein the amplifying module comprises:
    a first modulator, coupled to the clock generator and the processing module, for generating a first modulated signal by modulating an audio input signal and the processing signal according to an input clock;
    a second modulator, coupled to the clock generator and the processing module, for generating a second modulated signal by modulating the audio input signal and the processing signal according to the input clock;
    a control switch, having one terminal selectively coupled to the first modulator and the second modulator, for switching between the first modulator and the second modulator, thereby outputting the first modulated signal and the second modulated signal in response to a switch control signal; and
    an output stage circuit, coupled to another terminal of the control switch, for amplifying the first modulated signal and the second modulated signal and generating the amplifying signal.

6. The audio signal processing apparatus of claim 5, wherein the first modulator is a fixed clock pulse width modulator (PWM).

7. The audio signal processing apparatus of claim 5, wherein the second modulator is a sigma-delta pulse modulation pulse width modulator (PWM).

8. The audio signal processing apparatus of claim 5, wherein the control interface of the clock generator outputs the input clock to the first modulator and the second modulator.

9. The audio signal processing apparatus of claim 1, wherein the amplifying module is a power amplifier.

10. The audio signal processing apparatus of claim 1, wherein the amplifying module is a class D audio amplifier.

11. The audio signal processing apparatus of claim 1, wherein the output module is a speaker.

* * * * *